United States Patent [19]
Itoh et al.

[11] Patent Number: 4,957,880
[45] Date of Patent: Sep. 18, 1990

[54] METHOD FOR PRODUCING SEMICONDUCTOR DEVICE INCLUDING A REFRACTORY METAL PATTERN

[75] Inventors: Hitoshi Itoh, Mitaka; Takahiko Moriya, Yokosuka, both of Japan

[73] Assignee: Kabushiki Kaisha Toshiba, Kawasaki, Japan

[21] Appl. No.: 346,359

[22] Filed: Apr. 28, 1989

Related U.S. Application Data

[63] Continuation-in-part of Ser. No. 150,437, Feb. 1, 1988, abandoned, which is a continuation of Ser. No. 866,249, May 23, 1986, abandoned.

[30] Foreign Application Priority Data

May 29, 1985 [JP] Japan ................................ 60-116275

[51] Int. Cl.⁵ .................... H01L 21/283; H01L 21/268
[52] U.S. Cl. ...................................... 437/192; 437/201; 437/173; 437/245; 437/946; 148/DIG. 90; 148/DIG. 71; 427/53.1
[58] Field of Search ............... 437/173, 174, 187, 192, 437/245, 244, 201, 189, 946; 148/DIG. 71, DIG. 90; 427/53.1

[56] References Cited

U.S. PATENT DOCUMENTS

| | | | |
|---|---|---|---|
| 3,477,872 | 11/1969 | Amick | 437/178 |
| 3,785,862 | 1/1974 | Grill | 437/238 |
| 4,526,624 | 7/1985 | Tombrello et al. | 437/173 |
| 4,552,845 | 6/1985 | Powell et al. | 437/173 |
| 4,568,565 | 2/1986 | Gupta et al. | 437/245 |
| 4,597,167 | 7/1986 | Moziya et al. | 437/187 |
| 4,606,932 | 8/1986 | Opupki et al. | 427/53.1 |
| 4,615,904 | 10/1986 | Ehrlich et al. | 427/38 |
| 4,617,087 | 10/1986 | Iyer et al. | 437/187 |
| 4,626,315 | 12/1986 | Kitamoto et al. | 156/628 |
| 4,626,449 | 12/1986 | Hirai et al. | 427/53.1 |
| 4,699,801 | 10/1987 | Ito et al. | 437/245 |

FOREIGN PATENT DOCUMENTS

| | | |
|---|---|---|
| 0070751 | 1/1983 | European Pat. Off. . |
| 0156999 | 10/1985 | European Pat. Off. . |
| 0150239 | 11/1980 | Japan ................................ 437/174 |
| 0100451 | 8/1981 | Japan ................................ 437/174 |
| 0119853 | 7/1984 | Japan ................................ 437/173 |
| 2131608 | 6/1984 | United Kingdom ................. 437/123 |

OTHER PUBLICATIONS

Ehrlich et al., "Laser Microchemistry . . . ," *Thin Solid Films*, 90(1982), pp. 287–294.
Chang, "Writing SiO₂ . . . ," *IBM Tech. Disc. Bull.*, 20(6), Nov. 1977, p. 2459.
Calloway et al., "Vacuum Ultraviolet . . . ," *J. Vac. Sci. Technol.*, A., vol. 1, No. 2, Apr.–Jun. 1983, pp. 534–536.
McWilliams et al., "Wafer Scale Laser . . . ," *Appl. Phys. Lett.*, 43(10), Nov. 15, 1983, pp. 946–948.
Ehrlich et al., "Spatially Delineated . . . ," *Appl. Phys. Lett.*, vol. 38, No. 11, Jun. 1, 1981, pp. 946–948.
Broadbent, et al., "Selective Low Pressure CVD of Turpton," *J. Electro Chem. SOc.*, Jun. 1984, vol. 131, No. 6, pp. 1427–1433.
Allen et al., "Direct Writing Using Laser CVD," Laser Diag. and Photochem. Proc., Mrs. North Holland, 1983, pp. 207–213.
Brors, et al., "CVD Tungsten", *Solid State Tech.*, Apr. 1984, pp. 313–314.
Berg et al., "Deposition of Metal Films by Laser Controlled CVD," *Chemical Vapor Deposition*, Elect. Soc., 1973, pp. 196–205.

*Primary Examiner*—Brian E. Hearn
*Assistant Examiner*—T. N. Quach
*Attorney, Agent, or Firm*—Finnegan, Henderson, Farabow, Garrett and Dunner

[57] ABSTRACT

In the production method of a semiconductor device, a connection layer is formed on an insulating layer according to two steps of irradiating, in the atmosphere of a reaction gas, a region in which the connection layer is to be formed selectively by light having a wavelength in a range of from 200 to 1000 nm, and depositing selectively a connection layer forming substrate by a CVD method in the light irradiated region until a desired thickness of the substance is obtained.

6 Claims, 2 Drawing Sheets

METHOD FOR PRODUCING SEMICONDUCTOR DEVICE INCLUDING A REFRACTORY METAL PATTERN

This is a continuation-in-part of application Ser. No. 150,437, filed Feb. 1, 1988, now abandoned, which is a continuation of application Ser. No. 866,249, filed May 23, 1986 (now abandoned).

BACKGROUND OF THE INVENTION

This invention relates to a production method of a semiconductor device, and more particularly to a production method of a connecting layer of the semiconductor device.

According to the recent remarkable progress in seeking higher integration and higher operation speed, the integration pattern of a semiconductor device has become excessively minute and of a high density, so that the effective area required for connecting electrodes thereof is also tending to be increased inevitably. At present, aluminum and aluminum alloys which are economical and have low electrical resistance are widely used for connecting purposes. However, in a case where aluminum or an aluminum alloy is used in a VLSI as a connecting material, the following problems usually occur.

As a pattern becomes minute, the width of each connecting line is reduced. However, the voltage applied to the integrated circuit is held to, for instance, DC 5V, and hence electrical stress caused in the conecting line tends to increase. As a consequence, connecting line troubles frequently occur due to electromigration and the like when the line is made of aluminum or aluminum alloy.

As the second problem, the melting point of aluminum or aluminum alloy is comparatively low, being approximately 450° C., and therefore the temperature in the subsequent production steps must not exceed the melting point, thus reducing the productivity of the integrated circuit.

As the degree of integration increases, a multilayer arrangement of connecting conductors becomes essential. Since aluminum or aluminum alloy cannot ordinarily resist the temperature required for the formation of the interlayer insulating film, there is a restriction in selecting a suitable insulating film to be used between the connecting conductors, and the reliability of the multilayer connection is thereby impaired.

In order to obviate the above described difficulties of aluminum or aluminum alloy, a silicide film of a refractory metal has also been tried recently. Such a film can be easily obtained by firstly forming a layer of a refractory metal on a polysilicon film by a sputtering method or the like, and then annealing the layer in a temperature range of from 450° C. to 600° C. Alternatively, the silicide film of a refractory metal may be made directly by a CVD method using, for instance, tungsten hexafluoride ($WF_6$) and silane ($SiH_4$). However, the silicide film of a refractory metal has a line resistance as high as 10 to 100 micro-ohm/cm, which is much higher than the line resistance of aluminum which is approximately equal to 2.3 micro-ohm/cm.

In order to overcome this difficulty, a refractory metal film other than the above described silicide type, which is stable at a high temperature and exhibits a lower line-resistance than that of the silicide film is now studied intensively.

For the production of such a refractory metal film a sputtering method, a chemical gas-phase growing method (CVD methods) and the like are considered. The sputtering method is advantageous because a refractory metal film of an excellent quality can be produced. However, the target made of pure refractory metal is extremely expensive, and hence the method cannot be exercised practically. On the other hand, the CVD method permits to production of the refractory metal film at a comparatively low cost. However, the refractory metal film formed by the CVD method of an insulating layer made of, for instance, silicon dioxide ($SiO_2$) has exhibited an insufficiency in bonding with the underlying layer, thus making it difficult to use this method practically. Although there has been proposed a method wherein a connection pattern is firstly formed on an insulating layer by use of a polysilicon film, and the refractory metal film is thereafter formed on the connection pattern in accordance with the CVD method, such a method has complicated the production steps.

SUMMARY OF THE INVENTION

The object of the present invention is to provide a method for producing a semiconductor device wherein a connecting layer can be deposited on an underlying layer in a tightly bonded manner.

According to the invention, there is provided a method for producing a semiconductor device having an insulating layer formed on an element-formed portion of a substrate, comprising the steps of irradiating in an atmosphere of a reactive gas, a region of the insulating layer selectively by light and depositing a connection layer forming substance selectively on the light-indicated region of the insulating layer according to the chemical gas-phase growing (CVD) method.

The selective irradiation of light on the surface of the insulating layer on the substrate is performed by means of, for example, a photomask, thereby producing an intermediate product having good bonding characteristics with the insulating layer. Subsequently, a connection layer forming substrate is selectively deposited on the intermediate product by the CVD method.

DESCRIPTION OF THE PREFERRED EMBODIMENTS

Figure 1A:
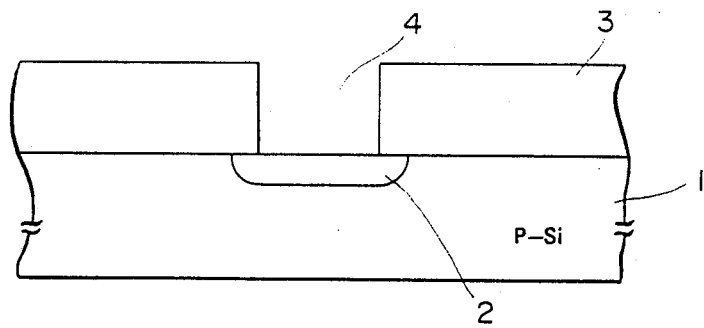
FIGS. 1(*a*), 1(*b*) and 1(*c*) are diagrams for explaining the formation of a connection pattern according to a preferred embodiment of this invention.

FIGS. 1(*a*) through 1(*c*) illustrate steps for forming a connection layer according to the present invention.

As shown in FIG. 1(*a*), an element formed region including a diffusion layer 2 and the like is firstly formed on a P-type silicon substrate 1 having been subjected to an element-separating operation. Then, the entire surface is coated by a silicon dioxide film 3, and contact holes 4 are bored through the silicon dioxide film 3. The substrate 1 thus formed is then placed in a CVD furnace, and under the flow of argon gas at a rate of 400 cc/min., the substrate 1 is heated and maintained at a temperature in a range of from 250° to 700° C.

A mixed gas consisting of hydrogen ($H_2$) and chlorine ($Cl_2$), or hydrogen chloride (HCl) gas is caused to glow through the CVD furnace, and the substrate 1 is irradiated by a light having a wavelength in the range of 200 to 1000 nm. The substrate 1 is thereafter subjected to an etching process lightly.

Figure 1B:
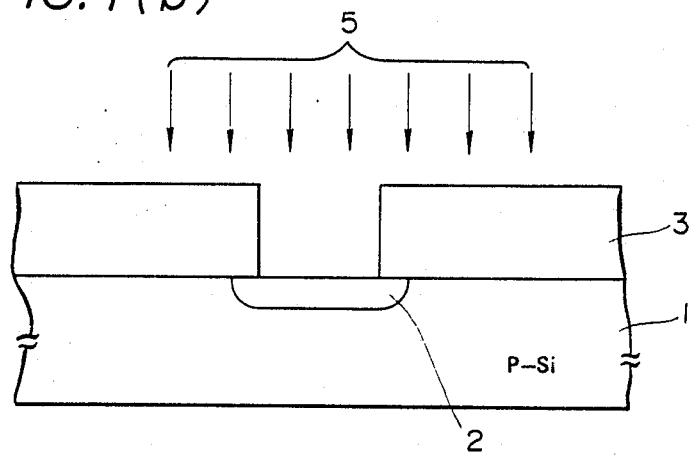

Then, the CVD furnace is filled with tungsten hexafluoride (WF$_6$) under a pressure of from 1 m Torr to 100 m Torr, and the substrate 1 is irradiated by light 5 as shown in FIG. 1(b), which has a wavelength in the range of 200 to 1000 nm through a photomask (not shown).

Figure 1C:
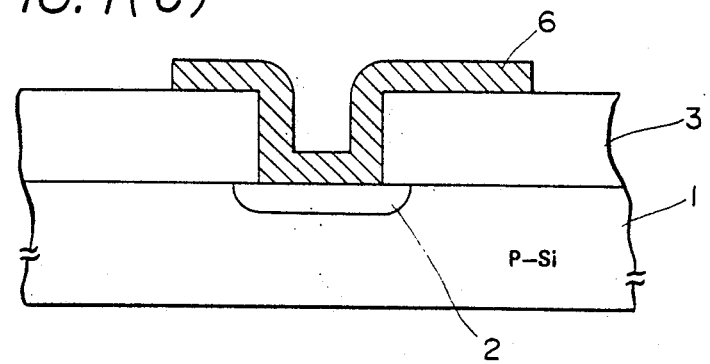

Then by use of a mixed gas made of tungsten hexafluoride (WF$_6$) held at a partial pressure of from $5 \times 10^{-4}$ to 50 Torr and hydrogen (H$_2$) held at a partial pressure of from 1 to 100 Torr as a reactive gas, an ordinary reduced-pressure CVD method is effectuated as shown in FIG. 1(c) while the substrate 1 is maintained at a temperature ranging from 250° to 700° C., so that a tungsten (W) film 6 is formed selectively at positions exposed to light in the above described step.

The tungsten film thus formed is found to be tightly bonded with the silicon dioxide film underlying the tungsten film, and even in a case where the tungsten film is used in the multilayer connection, with an insulating film formed afterward therebetween at a high temperature, there has been no bonding trouble between the tungsten film and the silicon dioxide film.

The aforementioned advantageous feature is considered to be provided because of the following reason.

Since the substrate has been irradiated in the tungsten hexafluoride atmosphere by light having a wavelength in a range of 200 to 1000 nm, an intermediate product of a high bonding property is created, and under the presence of this intermediate product, the tungsten film of a predetermined thickness is formed by the CVD method while the film is maintained in a highly bonded condition. Furthermore, since the connection pattern has been memorized by the intermediate product, the tungsten film can be produced selective during the subsequent CVD process without requiring any selectively depositing procedure.

In summarized form, the process of depositing a tungsten (W) film on the insulating layer of a substrate according to the present invention comprises a first step of (a) irradiating the surface of regions on the insulating layer selectively by light in a hydrogen gas free atmosphere comprising a refractory metal halide gas, and thereafter, (b) depositing the refractory metal film selectively on the light irradiated regions of the insulating layer by chemical vapor deposition (CVD) without irradiation using a gas mixture comprising the refractory metal halide gas and hydrogen gas.

It is important to note that light irradiation in Step (a) is performed not in an atmosphere of a mixed gas (e.g., WF$_6$+H$_2$) but in a hydrogen gas free atmosphere comprising the refractory metal halide gas so as to excite the refractory metal halide onto the light-irradiated surface regions of the insulating layer.

In step (a), the following reaction takes place,

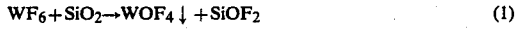

$$WF_6 + SiO_2 \rightarrow WOF_4 \downarrow + SiOF_2 \qquad (1)$$

and WOF$_4$, which is a product of the reaction, is adhered to the surface of the SiO$_2$ (insulating layer). This WOF$_4$ serves as a nucleus when W is deposited. With the aid of the nucleus, W can be firmly adhered to the irradiated area at a low temperature.

When the degree of vacuum is raised (i.e., in a higher vacuum), WOF$_4$ becomes a gas (WOF$_4$ ↑). In an appropriate degree of vacuum, WOF$_4$ takes the form of solid (WOF$_4$ ↓) and is adsorbed on the surface of SiO$_2$ (irradiated area).

Incidentally, the reasons why H$_2$ is excluded from the atmosphere are as follows:

(A) In an atmosphere of the mixed gas WF$_6$+H$_2$, H$_2$ will cause WF$_6$ to be reduced. As a result, W, although in a very small amount, is deposited onto both irradiated and nonirradiated area. By excluding H$_2$, Reaction (1) takes place by light irradiation without causing dissociation of WF$_6$, thereby enhancing selectivity.

(B) The concentration of WF$_6$ becomes higher.

Subsequent to Step (a) by which WOF$_4$ is adhered to the irradiated area, Step (b) is carried out.

In step (b), WF$_6$ is reduced and dissociated under the mixed gas of WF$_6$+H$_2$, and effectively deposited onto the nucleus WOF$_4$.

With the construction described above, the following advantages can be obtained.

(i) A precise refractory metal pattern can be formed because selectivity is very high.

(ii) Refractory metal film can be firmly adhered to the insulating layer at a low temperature with the aid of the nucleus of refractory metal oxihalide.

On the other hand, a reaction progresses by following the formula, WF$_6$(g)+3H$_2$(g)→W(s)+6HF(g), on the surface of the conductive layer as similar to the ordinary CVD method, resulting in the separation of W(s) on the conductive layer.

Thus in contrast to the conventional practice wherein it has been difficult to form a connecting layer made of a refractory metal on an insulating film in a highly bonded state, according to the present invention, forming such a connecting layer is made possible in a simple manner.

Furthermore, according to the method of this invention, a photolithographic process is not required, and the connection pattern is applied by light directly to the insulating film. This differs from the conventional method wherein the pattern has been applied to a photoresist film formed on the surface of the connecting film, the pattern is then developed, and an etching process has been carried out while utilizing the pattern thus developed as a mask. In accordance with the present invention, there is no possibility of accompanying contamination caused by resist or during processes, and the manufacturing process is therefore simplified. In addition, the thickness of the film forming the connection pattern may also be increased easily as desired.

Although in the above described embodiment, the element has been formed on a silicon substrate, it is apparent that the invention may also be applied to a case where the element is formed, for instance, on a sapphire substrate. That is, the invention may also be applied to a so-called SOS construction having a connection layer on such a substrate.

The atmosphere in which the light is irradiated is not necessarily the aforementioned WF$_6$ gas, but may be any reactive gas such as a halogen gas. In addition, the formation of the connection layer is not necessarily realized by the selective CVD method utilizing the refractory metal and hydrogen.

In the above described embodiment, the bonding property of the film has been improved by, prior to the formation of the film, irradiating the substrate by light under the flow of a halogen gas such as HCl for cleaning the surface. However, such an improving step may be omitted in accordance with the requirements.

Although in the embodiment, the region of forming the connection pattern has been defined by light-irradiating the insulating film through a photomask, any other method of irradiating the film selectively such as directly drawing the connection pattern by, for instance, argon an fluoride (ArF) eximer laser may otherwise be utilized.

Furthermore, the wavelength of the light used for the irradiation has been described to be in the range of 200 to 1000 nm. However, this may otherwise be selected suitably.

In the CVD step of the invention, no light-irradiation has been executed. However, by use of the light-irradiation also in the CVD step, the deposition as well as the selectivity thereof can be improved, and the connection pattern of a higher precision can be thereby realized.

Figure 2A:
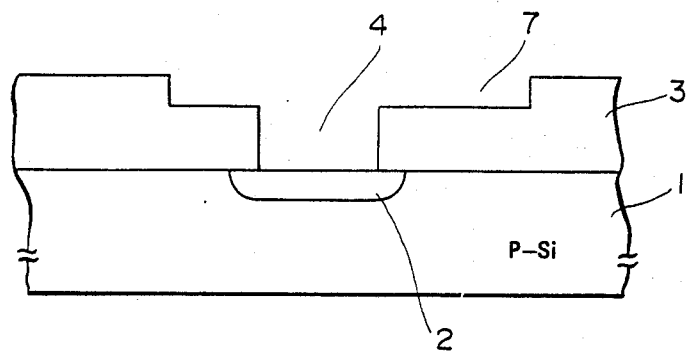
FIGS. 2(*a*) and 2(*b*) are diagrams for explaining another embodiment of the invention.
Figure 2B:
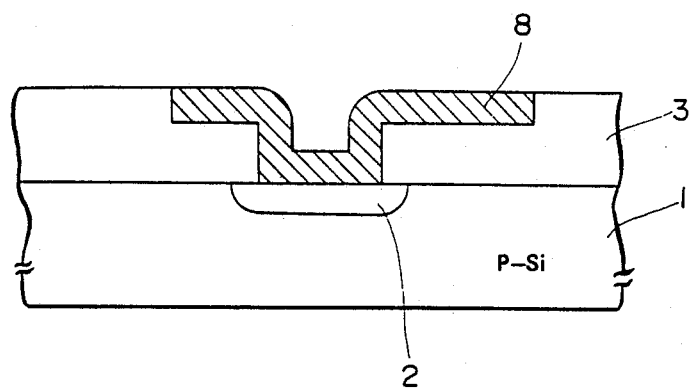

Further, in the above described embodiment, a connection pattern made of a refractory metal has been formed on a flat silicon dioxide film. However, instead of such a procedure, the invention may otherwise be executed in a manner such that a recessed portion 7 is formed on a silicon dioxide film 3, as shown in FIG. 2(a), at a position corresponding to a region to be formed into the connection layer, the film 3 is irradiated selectively by light as described in the embodiment, and then a tungsten film 8 is formed by the CVD method as shown in FIG. 2(b). In this manner, the surface of the substrate after the formation of the connection layer can be made flat. This method is particularly advantageous for producing a semiconductor device of a multilayer type.

Although it has been described that the connection pattern in the preferred embodiment of the present invention is made of a refractory metal, it is apparent that the invention is not to be restricted to such a construction, and an aluminum film made in accordance with the CVD method out of a organic aluminum pyrolytically may alternately be used for the construction of the connection pattern.

What is claimed is:

1. A method of forming a refractory metal pattern selectively on an insulating layer on a substrate comprising the steps of:
    irradiating, in a hydrogen gas free atmosphere comprising a refractory metal halide gas, on a region of said insulating layer selectively by light having a wavelength in a range of from about 200 to about 1000 nm, and
    depositing the refractory metal pattern selectively on said light-irradiated region of said insulating layer by a chemical vapor deposition (CVD) method without irradiation using a gas mixture comprising the refractory metal halide gas and hydrogen gas.

2. The method according to claim 1, wherein said insulating layer is a silicon dioxide film, and said refractory metal pattern is a tungsten film pattern.

3. The met hold according to claim 1, wherein said CVD method is a reduced pressure CVD method.

4. A method of forming a refractory metal pattern onto a substrate surface partially covered with an insulating layer, said pattern being formed on said insulating layer and extending onto an exposed surface of the substrate surface which is not covered with said insulating layer, comprising the steps of:
    irradiating, in a hydrogen gas free atmosphere comprising a refractory metal halide gas, on a region of said insulating layer selectively by light having a wavelength in a range of from about 200 to about 1,000 nm, and
    depositing the refractory metal pattern selectively on said light-irradiated region of said insulating layer by a chemical vapor deposition (CVD) method without irradiation using a gas mixture comprising the refractory-metal halide gas and hydrogen gas.

5. The method according to claim 4, further including forming said refractory metal pattern onto an exposed surface of the substrate surface which is not covered with said insulating layer, said exposed surface being a surface of a diffused layer formed in said substrate.

6. The method according to claim 4, further including forming said refractory metal pattern onto an exposed surface of the substrate surface which is not covered with said insulating layer, said exposed surface being a surface of a conductive layer with which said insulating layer is underlaid.

* * * * *